(12) United States Patent
Ward

(10) Patent No.: US 6,571,186 B1
(45) Date of Patent: May 27, 2003

(54) METHOD OF WAVEFORM TIME STAMPING FOR MINIMIZING DIGITIZATION ARTIFACTS IN TIME INTERVAL DISTRIBUTION MEASUREMENTS

(75) Inventor: Benjamin A. Ward, Portland, OR (US)

(73) Assignee: Textronix, Inc., Beaverton, OR (US)

( * ) Notice: Subject to any disclaimer, the term of this patent is extended or adjusted under 35 U.S.C. 154(b) by 80 days.

(21) Appl. No.: 09/652,939

(22) Filed: Aug. 31, 2000

Related U.S. Application Data

(60) Provisional application No. 60/153,978, filed on Sep. 14, 1999.

(51) Int. Cl.$^7$ ................................................ G01R 13/00
(52) U.S. Cl. ............................ 702/74; 702/66; 702/79; 702/187
(58) Field of Search ....................... 702/57, 64, 65, 702/66, 67, 68, 69, 70–74, 75–78, 79, 80, 124, 125, 126, 179–181, 187, 189; 324/76.12–76.38

(56) References Cited

U.S. PATENT DOCUMENTS

| | | | | |
|---|---|---|---|---|
| 4,364,080 A | * | 12/1982 | Vidovic | ...................... 348/185 |
| 5,233,545 A | * | 8/1993 | Ho et al. | ..................... 702/180 |
| 5,495,168 A | * | 2/1996 | de Vries | ...................... 324/121 |
| 5,508,605 A | * | 4/1996 | Lo et al. | .................. 324/76.42 |
| 5,809,177 A | * | 9/1998 | Metcalfe et al. | ............ 382/251 |
| 5,877,621 A | * | 3/1999 | Beyers et al. | ............... 324/121 |
| 6,253,161 B1 | * | 6/2001 | Arias-Estrada | ............. 702/150 |
| 6,263,290 B1 | * | 7/2001 | Williams et al. | .............. 702/71 |

\* cited by examiner

Primary Examiner—Marc S. Hoff
Assistant Examiner—Jeffrey R. West
(74) Attorney, Agent, or Firm—William K. Bucher

(57) ABSTRACT

A time stamping method for threshold crossing points of an input signal uses a dithered threshold level. Digital data samples are acquired for the input signal and time marks are determined for the threshold crossings using interpolation. The time marks are stores as the time stamps. A threshold offset value generator generates a distribution of offset values for dithering the threshold value. Time interval values are generated from the time stamps and the number of occurrences of time interval values are accumulated in time bins. A time interval distribution histogram and statistical time interval distribution data, such as the mean, standard deviation and minimum and maximum time intervals may be generated.

25 Claims, 6 Drawing Sheets

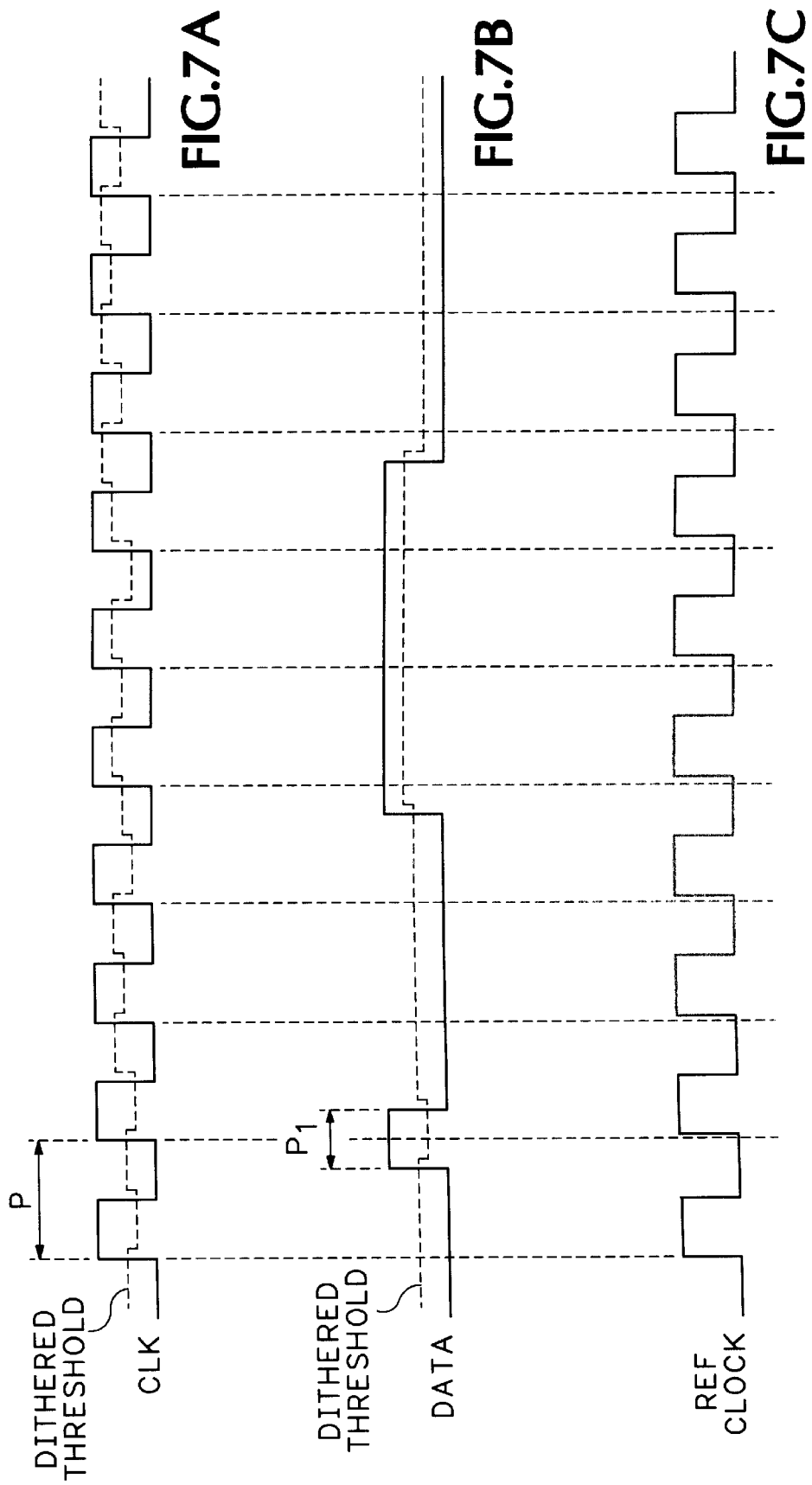

METHOD OF WAVEFORM TIME STAMPING FOR MINIMIZING DIGITIZATION ARTIFACTS IN TIME INTERVAL DISTRIBUTION MEASUREMENTS

CROSS-REFERENCE TO RELATED APPLICATION

This application claims the benefit of the U.S. Provisional Application No. 60/153,978, filed Sep. 14, 1999.

BACKGROUND OF THE INVENTION

The present invention relates generally to time stamping of threshold crossing points in an acquired waveform input signal where the time stamps are separated by one or more nominal time intervals and more particularly to a method of dithering a threshold level for making time stamp measurements of the crossing points. Such a method is usable in time interval distribution measurements for minimizing digitization artifacts.

Oscilloscopes are tradition measurement instruments for time interval measurements of an electrical or optical signals, such as pulse width, time period and the like. A threshold level is established and the signal crossing points through the threshold are time stamped, such as by placing cursors at the crossing points. The time interval between the time stamped locations is calculated and displayed as the time interval measurement.

Digital oscilloscopes have essentially replaced traditional analog oscilloscopes for measuring electrical signals. A digital oscilloscope receives an input analog signal and samples the signal at a defined sample rate established by the instrument setting parameters. The sampled signal is quantized by an analog-to-digital converter to discrete levels and the digitized signal samples are stored in memory. A threshold level is established and time marks of the signal crossing points through the threshold are determined by interpolating between signal samples above and below the threshold crossing. The interpolated time marks are used to calculate the time interval between the time marks.

The computer and telecommunications industry uses digital oscilloscopes to generate statistical time interval distribution measurements for verifying the telecommunications signal meets set standards for jitter. A waveform record of the telecommunications signal is acquired and stored. A threshold level is set and time stamps are determined for the threshold crossing points using interpolation of data point or points above and below the crossing points. Time interval values between time stamps are determined and the statistical time interval distribution measurements are performed. A histogram may be made of the time interval values versus the number of occurrences of the each value and displayed as well as a display of the statistical time interval distribution measurements.

A drawback to using digital oscilloscopes for calculating the time interval of a repetitive electrical signal is artifacts caused by the digitization of the electrical signal. Because quantization levels are fixed, sampled data values above and below the nominal threshold take on a limited set of combinations. This results in time marks that fall at a limited set of interpolated locations between sample points. Time interval measurements made with these time marks will result in a time interval variances. A distribution histogram of the time intervals with digitization artifacts appears as discrete spikes in the plot. This may appear to a user as jitter in the incoming electrical signal where as in fact it is caused by the digitization of the signal.

One way of reducing the digitization artifact is to add a random amount of noise to the acquired signal samples by dithering the samples. A random number generator provides random numbers that are applied to each signal sample. The result of offsetting the signal samples with random numbers is statistically spreading the threshold crossing points of the signal. Even though the time interval distribution is spread out in relation to the digital artifact distribution, the statistical time interval distribution measurements provide a more accurate information on time interval and jitter.

The above method for reducing digitization artifacts has the drawback of being computationally expensive and/or slow. Random numbers are added to each signal sample. For a digital oscilloscope sampling systems with high sample rates, this add substantial digital processing overhead that is performed by the processor. A separate processor or digital signal processor (DSP) may be used to perform the dithering operation but such an addition adds cost to the oscilloscope.

What is needed is a method for time stamping threshold crossing points of a input signal having one or more nominal time intervals that has improved processing throughput. The method should not require adding additional hardware to the oscilloscope. The time stamping method is usable in generating statistical time interval distribution measurements and histogram displays having reduced the digitization artifacts.

SUMMARY OF THE INVENTION

Accordingly, the present invention is a method for time stamping an input signal having one or more nominal time intervals that is usable for minimizing digitization artifacts in time interval distribution measurements. The time stamping method randomly dithers the threshold level to vary the threshold crossing points of the input signal. The steps for time stamping includes the steps of establishing a threshold level for measuring a time mark of a threshold crossing point and acquiring digital data samples representative of the input signal prior and subsequent to the threshold crossing. The threshold crossing point is determined by interpolating at least a first data sample above and a first data sample below the threshold crossing point. The time mark for the interpolated threshold crossing point is stored as the time stamp. The threshold level is varied, using threshold offset values, for subsequent threshold crossings of the input signal with digital data samples acquired prior and subsequent to the crossing points interpolated to determine the threshold crossing points. The time marks for the crossing points are stored as the time stamps.

The threshold level establishing includes the further step of generating a distribution threshold values. Preferably, the distribution is a gaussian distribution. The interpolating step includes the further step of linearly interpolating between the first data sample above the threshold crossing point and the first data sample below the threshold crossing point. A higher order interpolator using multiple data samples above and below the threshold crossing point may be implemented, such as by generating a windowed sin(x)/x function.

The time stamping method includes the additional steps of generating time interval values defined as the difference between two time stamps and accumulating the number of occurrences of the time interval values in time bins. Alternately, the time interval values may be generated between time stamps in two separate waveforms or between time stamps in a waveform and a set of reference times. Further steps include generating and displaying a distribution histogram of the number of occurrences of the time interval values in the accumulated time bins. Still further steps include generating and displaying statistical distribution data of the time interval values from the accumulated time bins for mean, standard deviation, and minimum and maximum time intervals.

The time stamping method is incorporated into a method of minimizing digitization artifacts in time interval distribution measurements on an input signal having one or more nominal time intervals. The previously described time stamping method uses a dithered threshold level to generate the time stamps of the input signal threshold crossing points. Linear or higher order interpolation, such as a windowed sin(x)/x function, are two alternative steps for determining the threshold crossing points. The threshold dithering is accomplished by the step of generating a distribution of threshold values. Time interval are generated and the number of occurrences of the time interval values are accumulated in time bins. Statistical distribution data is generated from the time bin accumulated time interval values for mean, standard deviation, and minimum and maximum time interval values. An additional step includes the display of the statistical distribution data for the time interval values. Further steps include generating and displaying a histogram of the number of occurrences of the time interval values in the time bins.

The objects, advantages and novel features of the present invention are apparent from the following detailed description when read in conjunction with appended claims and attached drawings.

BRIEF DESCRIPTION OF THE DRAWINGS

FIG. 7A is a clock signal waveform showing the dithered threshold level in the method of time stamping an input signal according to the present invention.

FIG. 7B is a data signal waveform showing the dithered threshold level in the method of time stamping an input signal according to the present invention.

FIG. 7C is a reference signal waveform level in the method of time stamping an input signal according to the present invention.

DETAILED DESCRIPTION OF THE PREFERRED EMBODIMENT

Figure 1:
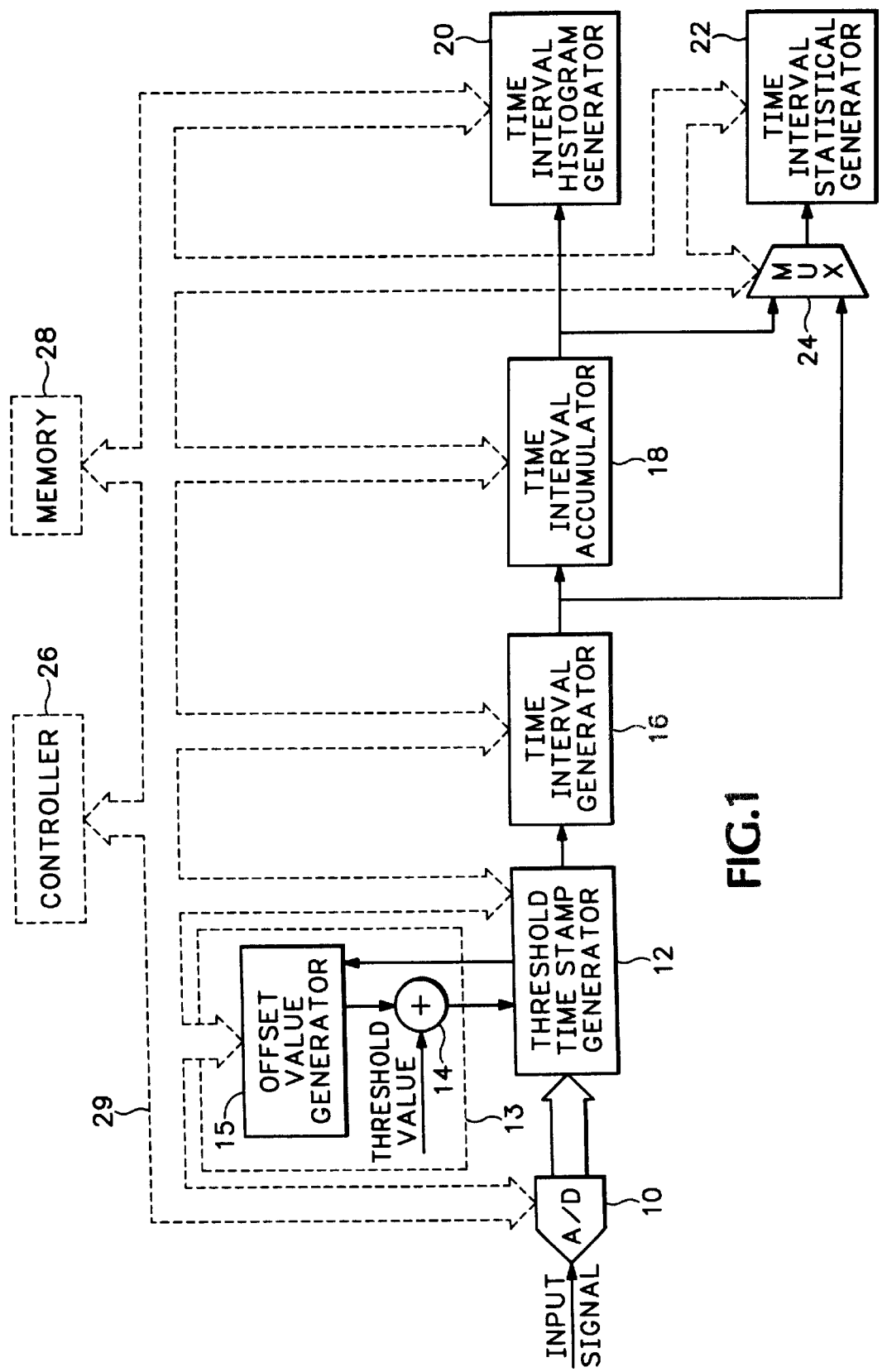
FIG. 1 is a functional block diagram illustrating the method of time stamping an input signal according to the present invention.

Referring to FIG. 1, there is shown a functional block diagram illustrating the method of time stamping an input signal of the present invention. The functional block diagram includes an analog-to digital (A/D) converter 10 receiving an input signal. A threshold time stamp generator 12 receives the digital data samples as well as a initial threshold value from a threshold offset value generator 13. The threshold offset value generator 13 has a summing circuit 14 that receives a threshold value and an offset value generated by an offset value generator 15 that produces a distribution of offset values. The summing circuit 14 combines the threshold level with the offset values from the offset value generator 15 to produce a dithered threshold value to be described in greater detail below. The threshold time stamp generator 12 calculates time stamps for the threshold crossing points of the input signal using the threshold level from the threshold offset value generator. A time interval generator 16 receives the calculated time stamps and generates time interval values from the time stamps. A time interval accumulator 18 has time bins with selectable bins widths that totals the number of occurrences of the time interval values that fall within each of the bin spans. A time interval histogram generator 20 receives the accumulated time interval occurrences from the time bins and generates a graphic representation of the accumulated time interval occurrences versus the time bin values for output to a display. A time interval statistical generator 22 also receives the accumulated time interval occurrences from the time bins or the time interval values from the time interval generator via a multiplexer 24. The time interval statistical generator 22 generates statistical data on the time interval values for the mean, standard deviation and minimum and maximum time intervals.

FIG. 1 also shows a dashed line controller 26 and memory 28 connected by a signal and data bus 29 to the A/D converter 10 and functional blocks 12, 13, 16, 18, 20, and 22. In the preferred implementation of the time stamping method of the present invention, the digital data samples from the A/D converter 10 are stored in memory 28 and processed by the controller 26, such as microprocessor or the like, under program control that perform the operations of the functional block 12, 13, 16, 18, 20, and 22. Alternately, the dashed elements 26, 28 and 29 represent a memory and digital signal processor (DSP) for each functional block 12, 13, 16, 18, 20, and 22 for performing the operations of the functional block. Provided that the DSPs and memories had sufficient processing speed, the alternative functional blocks could perform real time time stamping of the threshold crossing points and time interval histogram and statistical generation.

Figure 2:
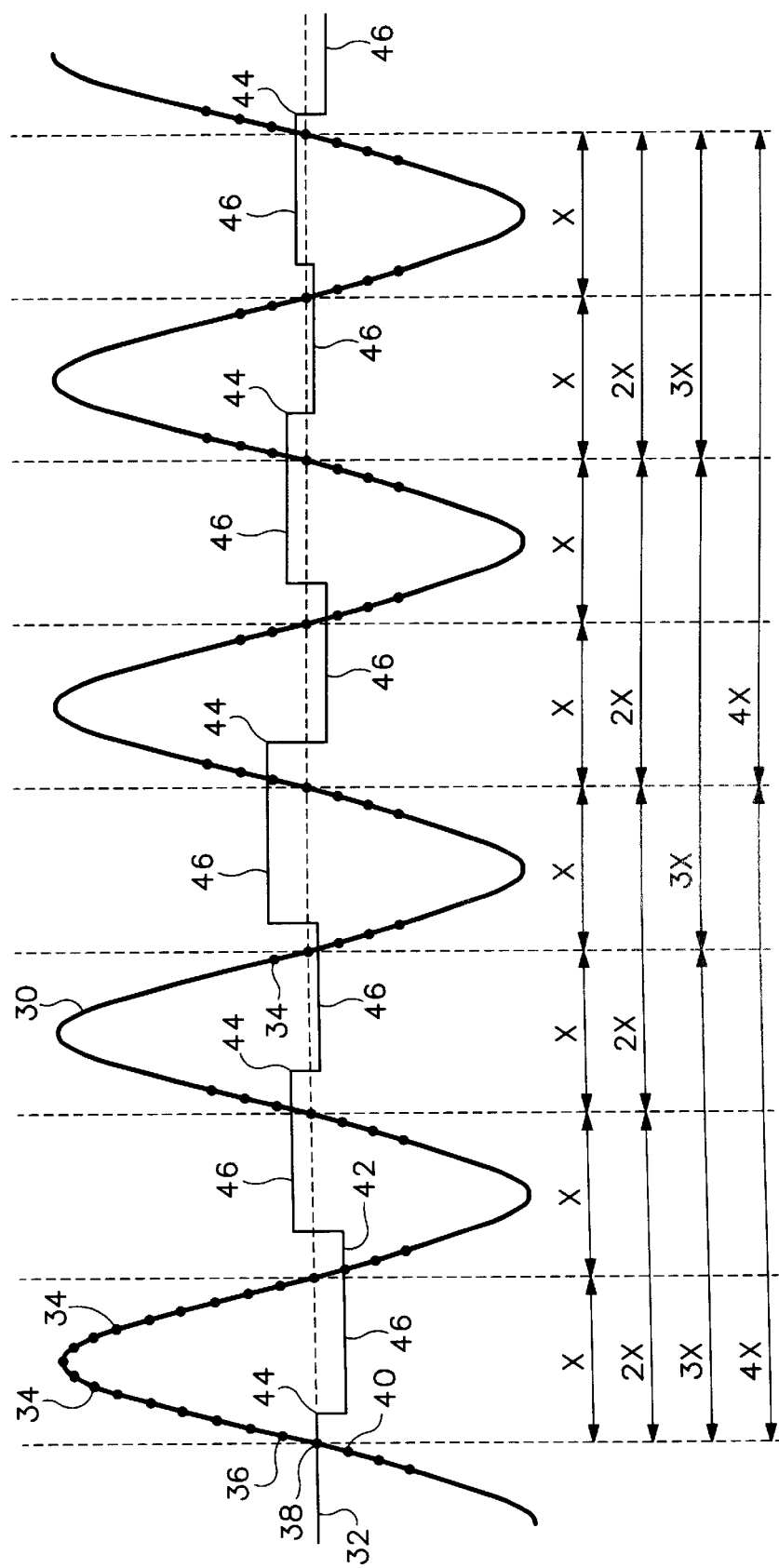
FIG. 2 is a illustration of an acquired waveform having a dithered threshold level in the method of time stamping an input signal according to the present invention.

Referring to FIG. 2, there is illustrated an acquired input signal waveform 30 having a dithered threshold level used in the method of time stamping an input signal of the present invention. Time is in the horizontal direction and magnitude is in the vertical direction. The input signal has a first nominal time interval "x" and additional nominal time intervals 2"x", 3"x", 4"x", . . . n"x" that a integer multiples of the first nominal time interval. The initial threshold value 32 is shown as a dashed line through the waveform 30. Digital data sample points are shown as dots 34 on the waveform 30 with the sample points across the threshold level being shown for each threshold crossing point.

Figure 3:
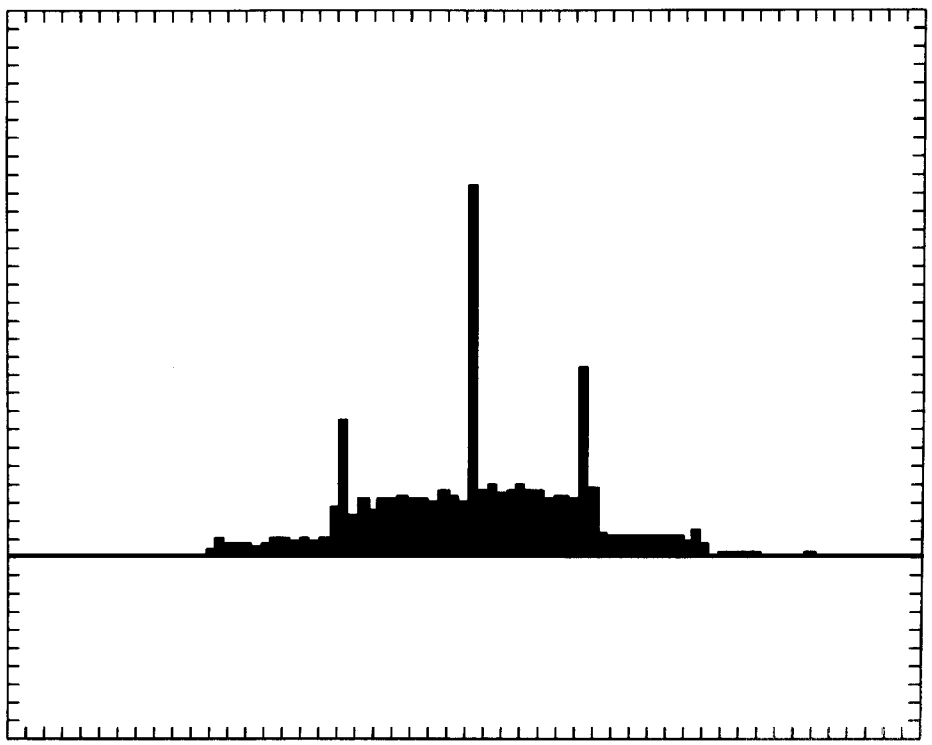
FIG. 3 is a time interval distribution histogram illustrating digitization artifacts in an acquired input signal.
Figure 4:
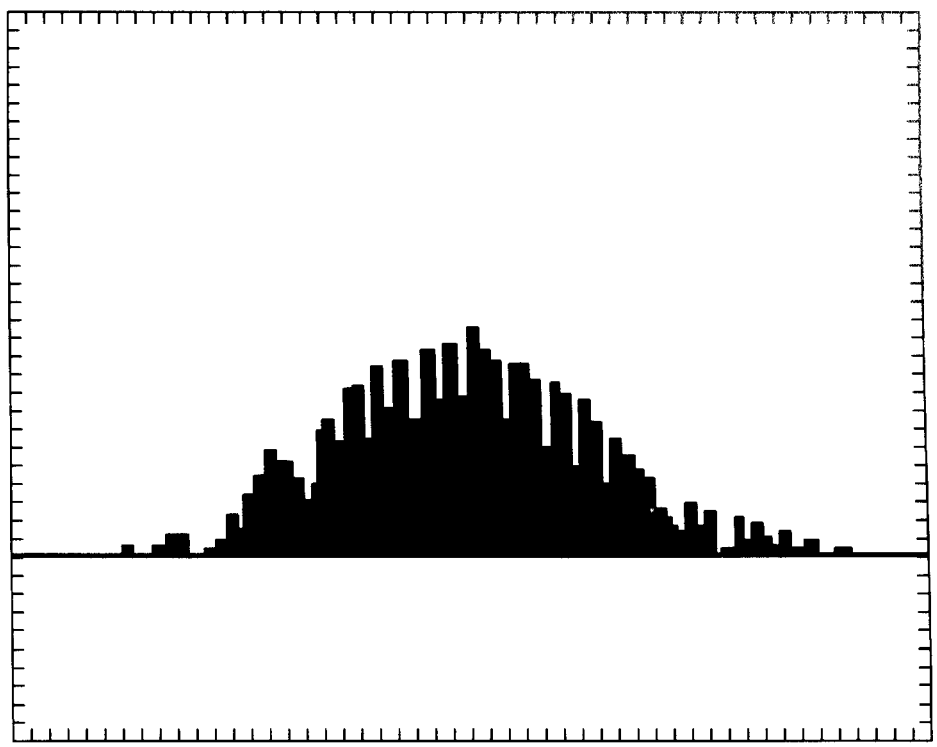
FIG. 4 is a time interval distribution histogram illustrating the suppression of the digitization artifacts using the dithered threshold level in the method of time stamping an input signal according to the present invention.

As previously described, because the quantization levels are fixed, the sampled data values above and below the nominal threshold value take on a limited set of combinations. The resulting time marks fall at a limited set of interpolated locations between the sample points. Time interval measurements made with these time marks will show digitization artifacts as graphically shown by the spikes in the time interval histogram of FIG. 3. The time stamping method of the present invention dithers the threshold level to randomly vary the threshold crossing points of the input signal. The resulting time interval distribution of the input signal time intervals statistically spreads out and masks the digitization artifacts. This is graphically shown in the time interval histogram of FIG. 4.

Returning to FIG. 2, the digital data samples 34 of the input waveform 30 are preferably acquired as a single data record and stored in memory. Linear interpolation is performed on at least a first data sample 36 above the threshold crossing point 38 and a first data sample 40 below the threshold crossing point 38 to determine a time mark for the crossing point 38. Higher order interpolation may be used for determining the time mark for the crossing point 38, such as a windowed sin(x)/x function using multiple samples above and below the crossing point 38. The time mark for the threshold crossing point 38 is stored in memory as the time stamp and the threshold level is randomly dithered for the next threshold crossing point 42. To prevent the generation of a false time mark in a noisy input signal, the dithering of the threshold level is offset a number of data samples away from the crossing points, as shown at 44. The threshold level dithering is preferably accomplished using an offset value generator producing a distribution of random values. The offset value generator may be implemented in either hardware or software. Preferably, the offset value generator produces a gaussian distribution of values. Other distributions of the offset values may be used as long as they suppress the digitization artifacts. The random values are added to the threshold values to create a new threshold values, such as threshold values 46. The digital data samples above and below the new threshold levels are interpolated to produce the time marks for the threshold crossing points and stored as the time stamps of the crossings. The dithering of the threshold level and the time stamping of the crossing points are repeated through the waveform record. Depending on the time interval measurement being made, the time stamping of the threshold crossings may occur at less than each crossing point. For example, if one is performing a period time interval measurement, time stamps need only be acquired for every other threshold crossing point.

The above described time stamping of threshold crossing points using a dithered threshold value substantially decreases the processing time for generating time interval distribution data. The frequency of generating a random threshold offset is less than the frequency of generating random data point offsets. Dithering a single value, i.e the threshold value, is computationally more efficient than dithering all or a portion of the digital data samples. Further, the time stamping method the present invention using a dithered threshold level lends itself to real time processing of time interval distribution data.

Figure 5:
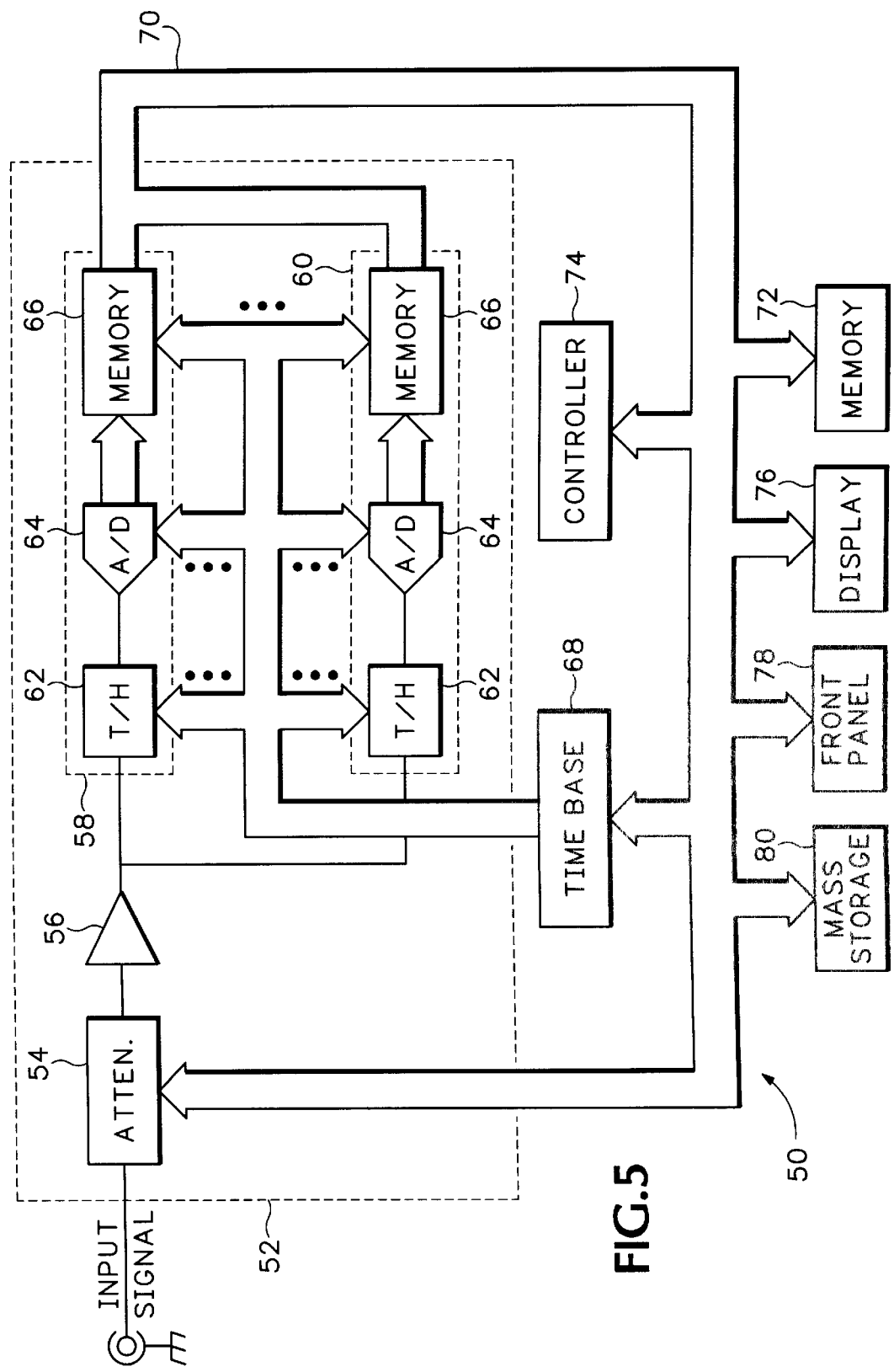
FIG. 5 is a representative block diagram of a digital oscilloscope used in implementing the method of measuring the time interval of an input waveform according to the present invention.

Referring to FIG. 5, there is shown a representative block diagram of a digital oscilloscope 50 used in implementing the method of time stamping an input signal using a dithered threshold level of the present invention. The digital oscilloscope 50 has an acquisition system 52 that may be implemented in a number of ways. The input signal is coupled through a variable attenuator 54 and a preamplifier 56. In high digitizing rate sampling oscilloscopes, such as the TDS7104 Digital Oscilloscope, manufactured and sold by Tektronix, Inc. Beaverton, Oregon and assignee of the instant invention, each input channel has digitizing pipes, as representatively shown as pipes 58 and 60. Any number of pipes may be included for each oscilloscope input channel. Each pipe has a track-and-hold (T/H) circuit 62, an analog-to-digital (A/D) converter 64 and a memory 66. A time base 68 provides timing signals to the acquisition system 52 for latching an analog value of the input signal in the T/H circuits 62, clocking the A/D converters 64 to digitize the analog value on the T/H circuit and storing the digitized values in memories 66. The pipes 58, 60 have additional circuitry (not shown) that offsets or delays the time base signals for each pipe 58, 60 to produce an acquisition rate "X" times the timing signal rate where "X" is the number of pipes in the acquisition system 52. The digital data samples, representative of the input signal are output from the acquisition system 52 via system bus 70. Memory 72 is coupled to bus 70 and includes both RAM, ROM and cache memory with the RAM memory storing volatile data, such as the digital data samples of the input signal, calculated time interval values, statistical time interval distribution data, and the like. The memory 72 is coupled via the system bus to a controller 74, such as CELERON™ or PENTIUM® microprocessor, manufactured and sold by Intel, Corp., Santa Clara, Calif. The system bus 70 is also connected to the variable attenuator 54, a display device 76, such a liquid crystal display, cathode ray tube or the like, and a front panel 78 with buttons, rotatable knobs and the like and/or control entry devices, such as a keyboard and/or mouse. A mass storage unit or units 80, such as a hard disk drive, CD ROM drive, tape drive, floppy drive or the like that reads from and/or writes to appropriate mass storage media, may also be connected to the system bus 70. Program instructions for controlling the digital oscilloscope 50, implementing the time stamping method using a dithered threshold level, and generating time interval distribution histograms and statistical data may be stored and accessed from the ROM memory 72 or from the mass storage media of the mass storage unit 80. The digital oscilloscope 50 is a PC based system controlled under WINDOWS® 98 operating system, manufactured and sold by Microsoft, Corp., Redmond, Wash.

Figure 6:
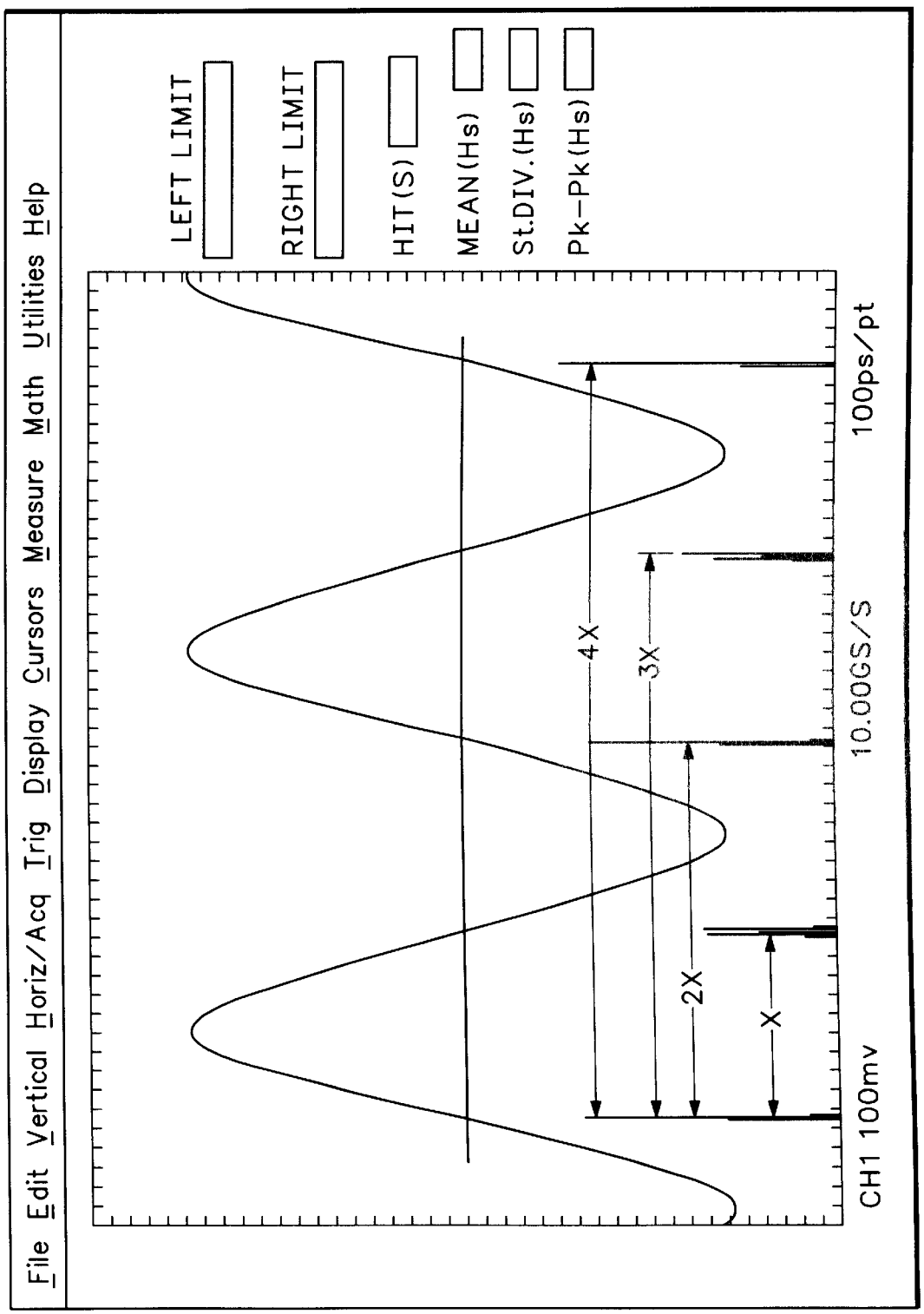
FIG. 6 is a representative display from the digital oscilloscope illustrating time interval distribution histograms and statistical distribution data resulting from the method of time stamping an input signal according to the present invention.

The front panel 78 is used to set acquisition and display parameters, such as sample rate, horizontal and vertical scales, and the like, for the digital oscilloscope 50. Additional parameter would include invoking the time interval distribution measurements and setting the bin width for the time interval accumulator and histogram display. An input signal, such as a 622.8 MHZ or 1.44 MHZ telecommunications signal is coupled to the channel input of the oscilloscope 50. The acquisition system 52 is activated to acquire a waveform record of the input signal. The digital data samples in the memories 66 of the acquisition system 52 are passed to the system memory 72 via the system bus 70. The controller 74 operating under program control from programs stored in memory 72 displays a portion of the stored waveform acquisition. A separate display processor may be used to generate displays on display device 76. The controller 74 further time stamps the threshold crossing points of the acquired input signal using the dithered threshold levels as previously described. Time interval values are generated using the time stamps and the number of time interval occurrences falling within the respective time bins are accumulated. One or more distribution histograms are generated for the threshold crossing points of the displayed waveform and displayed on display 76 as shown in digital oscilloscope display of FIG. 6. The controller 74 processes the time interval occurrences in the time bins to generate statistical distribution data on the time intervals including the mean, standard deviation and the minimum and maximum or peak-to-peak time intervals in the distribution data.

The above described threshold crossing time stamping method and time interval distribution measurements are performed on a input signal that is applied to an input channel of the acquisition system 52 of the digital oscilloscope 50. The time stamping method and time interval distribution measurements may also be implemented on multiple waveforms applied to different input channels of the acquisition system 52. Referring to FIG. 7A, there is shown a waveform of a clock signal, such as might be generated in a telecommunications system. The time stamping method using dithered threshold levels is used to time stamp the threshold crossings of the clock signal. Statistical distribution data is generated for the clock signal to establish a mean time interval period "P". Using a fifty percent threshold crossing point as a reference, the threshold crossing times of the clock signal period may be determined.

FIG. 7B shows a data signal that is acquired on a separate input channel of the acquisition system 52. The time stamping method using dithered threshold levels is used to time stamp the threshold crossing points of the data signal. Statistical distribution data is generated for the data signal to establish a time mean time interval period "$P_1$". Using a fifty percent threshold crossing point as a reference, the threshold crossing times of the data signal period may be determined. The time interval difference between the rising clock edges and the rising data edges can then be determined and stored in time bins for generating a time interval difference distribution histogram. Statistical distribution data can also be generated from the time interval difference values.

FIG. 7C shows a reference signal, such as a reference clock signal, for determining time interval differences between the reference clock and a clock signal. The reference clock signal may be a set of reference times stored in memory 72 or may be generated from the clock signal of interest. The frequency of the clock signal of interest is estimated by averaging a large number of clock periods. The estimated clock frequency is used as a reference frequency for the reference signal and the fifty percent crossings are time stamped and stored as reference times. The time stamping method using dithered threshold levels is used to time stamp the threshold crossings of the clock signal of interest and statistical distribution data is generated for the clock signal to establish a mean time interval period "P". The time interval difference between the rising edges of the clock signal of interest and the reference time of a corresponding rising edge of the reference clock can then be determined and stored in time bins for generating a time interval difference distribution histogram. Statistical distribution data can also be generated from the time interval difference values.

A method has been described for time stamping threshold crossing points of an input signal using a dithered threshold level. At a maximum, the threshold level is varied for each threshold crossing of the input signal. Digital data samples are acquired for the input signal and time marks are determined for the threshold crossings using interpolation. The time marks are stores as the time stamps. A threshold offset value generator or the like generates a distribution of offset values for dithering the threshold value. The interpolation of the threshold crossing points may be accomplished using linear two point interpolation, multipoint interpolation having more than point above and below the threshold crossing, such as a windowed sin(x)/x interpolation or the like. Time interval values are generated from the time stamps. The number of occurrences of time interval values are accumulated in time bins and a time interval distribution histogram is generated. The accumulated time interval values in the time bins are processed to generate statistical time interval distribution data, such as the mean, standard deviation and minimum and maximum time intervals.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of time stamping threshold crossing points of an input signal having one or more nominal time intervals comprising the steps of:
   a) establishing a threshold level for measuring a time mark of the threshold crossing point;
   b) acquiring digital data samples representative of the input signal prior and subsequent to the threshold crossing;
   c) interpolating between at least a first data sample above and a first data sample below the threshold crossing point;
   d) storing the time mark for the interpolated threshold crossing point as the time stamp; and
   e) repeating steps (a) through (d) while varying the threshold level, using a distribution of random threshold offset values for the threshold crossings of the input signal to minimize digitization artifacts in the time marks and to acquire a sequence of time stamps for the threshold crossing points.

2. The method of time stamping a threshold crossing point as recited in claim 1 further comprising the step of generating time interval values.

3. The method of time stamping a threshold crossing point as recited in claim 2 wherein the step of generating time interval values further comprises the step of determining the difference between two time stamps in the input signal.

4. The method of time stamping a threshold crossing point as recited in claim 2 wherein the step of generating time interval values further comprises the step of determining the difference between two time stamps with one time stamp being from the input signal and the other time stamp being from a data signal.

5. The method of time stamping a threshold crossing point as recited in claim 2 wherein the step of generating time interval values further comprises the step of determining the difference between two time stamps with one time stamp being from the input signal and the other time stamp being a stored reference time value.

6. The method of time stamping a threshold crossing point as recited in claim 2 wherein the step of generating time interval values further comprising the step of accumulating the number of occurrences of the time interval values in time bins.

7. The method of time stamping a threshold crossing point as recited in claim 6 wherein the accumulating step further comprising the step of generating a distribution histogram of the number of occurrences of the time interval values from the accumulated time bins.

8. The method of time stamping a threshold crossing point as recited in claim 7 wherein the distribution histogram generating step further comprising the step of displaying the distribution histogram of the time interval value occurrences.

9. The method of time stamping a threshold crossing point as recited in claim 6 wherein the accumulating step further comprising the step of generating statistical distribution data of the number of occurrences of the time interval values from the accumulated time bins for mean, standard deviation, and minimum and maximum time intervals.

10. The method of time stamping a threshold crossing point as recited in claim 9 wherein the statistical distribution data generating step further comprising the step of displaying the statistical distribution data of the time interval value occurrences.

11. The method of time stamping a threshold crossing point as recited in claim 1 wherein the threshold level establishing step further comprises the step of generating a distribution of threshold offset values.

12. The method of time stamping a threshold crossing point as recited in claim 1 wherein the interpolating step further comprises the step of linearly interpolating between the first data sample above the threshold crossing point and the first data sample below the threshold crossing point.

13. The method of time stamping a threshold crossing point as recited in claim 1 wherein the interpolating step further comprises the step of generating a higher order interpolator using multiple digital data samples above and below the threshold crossing point.

14. The method of time stamping a threshold crossing point as recited in claim 13 wherein the generating a higher order interpolator step further comprises the step of generating a windowed sin(x)/x function.

15. A method of generating time interval distribution measurements on an input signal having one or more nominal time intervals comprising the steps of:

a) establishing a threshold level for measuring a time mark of the threshold crossing point;

b) acquiring digital data samples representative of the input signal prior and subsequent to the threshold crossing;

c) interpolating between at least a first data sample above and a first data sample below the threshold crossing point;

d) storing the time mark for the interpolated threshold crossing point as the time stamp;

e) repeating steps (a) through (d) while varying the threshold level, using a distribution of random threshold offset values for the threshold crossings of the input signal to minimize digitization artifacts in the time marks and to acquire a sequence of time stamps for the threshold crossing points;

(f) generating time interval values defined as the difference between two time stamps;

(g) accumulating the number of occurrences of the time interval values in time bins; and (h) generating statistical distribution data of the number of occurrences of the time interval values from the accumulated time bins for mean, standard deviation, and minimum and maximum time interval values.

16. The method of minimizing digitization artifacts in time interval measurements as recited in claim 15 wherein the step of generating time interval values further comprises the step of determining the difference between two time stamps in the input signal.

17. The method of minimizing digitization artifacts in time interval measurements as recited in claim 15 wherein the step of generating time interval values further comprises the step of determining the difference between two time stamps with one time stamp being from the input signal and the other time stamp being from a data signal.

18. The method of minimizing digitization artifacts in time interval measurements as recited in claim 15 wherein the step of generating time interval values further comprises the step of determining the difference between two time stamps with one time stamp being from the input signal and the other time stamp being a stored reference time value.

19. The method of minimizing digitization artifacts in time interval measurements as recited in claim 15 wherein the generating the statistical distribution data further comprising the step of displaying the statistical distribution data of the time interval value occurrences.

20. The method of minimizing digitization artifacts in time interval measurements as recited in claim 15 wherein the accumulating step further comprising the step of generating a distribution histogram of the number of occurrences of the time interval values from the accumulated time bins.

21. The method of minimizing digitization artifacts in time interval measurements as recited in claim 20 wherein the distribution histogram generating step further comprising the step of displaying the distribution histogram of the time interval value occurrences.

22. The method of minimizing digitization artifacts in time interval measurements as recited in claim 15 wherein the threshold level establishing step further comprises the step of generating a distribution of threshold offset values.

23. The method of minimizing digitization artifacts in time interval measurements as recited in claim 15 wherein the interpolating step further comprises the step of linearly interpolating between the first data sample above the threshold crossing point and the first data sample below the threshold crossing point.

24. The method of minimizing digitization artifacts in time interval measurements as recited in claim 15 wherein the interpolating step further comprises the step of generating a higher order interpolator using multiple digital data samples above and below the threshold crossing point.

25. The method of minimizing digitization artifacts in time interval measurements as recited in claim 24 wherein in the step of generating a higher order interpolator further comprises the step of generating a windowed sin(x)/x function.

* * * * *